United States Patent
Ito

(10) Patent No.: US 8,120,420 B2
(45) Date of Patent: Feb. 21, 2012

(54) DEMODULATORS

(75) Inventor: Katsuhisa Ito, Kanagawa (JP)

(73) Assignee: Sony Corporation, Tokyo (JP)

(*) Notice: Subject to any disclaimer, the term of this patent is extended or adjusted under 35 U.S.C. 154(b) by 27 days.

(21) Appl. No.: 12/805,338

(22) Filed: Jul. 27, 2010

(65) Prior Publication Data

US 2011/0043276 A1    Feb. 24, 2011

(30) Foreign Application Priority Data

Aug. 24, 2009  (JP) .................... 2009-193393

(51) Int. Cl.
*H03D 1/00*  (2006.01)
*H03D 1/04*  (2006.01)
*H03D 1/06*  (2006.01)
*H03D 1/18*  (2006.01)

(52) U.S. Cl. ......... 329/353; 329/349; 329/363; 329/364

(58) Field of Classification Search .......... 329/347, 329/349–353, 363–366; 327/50; 455/337
See application file for complete search history.

(56) References Cited

U.S. PATENT DOCUMENTS 5,637,999 A * 6/1997 Hennecken .................. 324/212

FOREIGN PATENT DOCUMENTS

JP  57-037905  3/1982

* cited by examiner

*Primary Examiner* — David Mis
(74) *Attorney, Agent, or Firm* — Rader, Fishman & Grauer PLLC

(57) ABSTRACT

Disclosed herein is a demodulator, including: a splitting/matching section for carrying out a matching process of making the amplitude and phase of a first modulated signal match respectively the amplitude and phase of a second modulated signal; and a demodulation section for generating a demodulated signal on the basis of the first modulated signal and the second modulated signal, which have been subjected to the matching process carried out by the splitting/matching section, wherein the splitting/matching section has a splitting section, a first matching section, and a second matching section, the first circuit-element constants determining the first input impedance of the first matching section and the second circuit-element constants determining the second input impedance of the second matching section are set at values determined in advance in order to make the first input impedance equal to the second input impedance.

8 Claims, 8 Drawing Sheets

WITHOUT WEAK-INPUT (LONG-DISTANCE) DC CORRECTION

WITHOUT STRONG-INPUT (SHORT-DISTANCE) DC CORRECTION

WITH STRONG-INPUT (SHORT-DISTANCE) DC CORRECTION

DEMODULATORS

BACKGROUND OF THE INVENTION

1. Field of the Invention

The present invention relates to demodulators specifically, to a demodulator capable of avoiding phase and amplitude shifts between a first modulated signal and a second modulated signal by making the input impedance of a first matching section employed in a splitting/matching section for receiving the first modulated signal equal to the input impedance of a second matching section which is also employed in the splitting/matching section for receiving the second modulated signal.

2. Description of the Related Art

In recent years, high-peed transmission technologies making use of a high-frequency band such as a millimeter-wave frequency band are being intensively and extensively researched with an aim to transmit a signal at smaller power consumption and a lower transmission cost due to a smaller circuit scale through the use of CMOS (complementary metal oxide semiconductor) technology. A signal transmission apparatus making use of a high-frequency band is configured to employ a modulator for transmitting a modulated signal of a millimeter-wave frequency band and a demodulator for receiving the modulated signal from the modulator and generating the modulated signal.

A demodulator 600 employed in the existing signal transmission apparatus is explained. As shown in FIG. 10, a modulated signal received by an antenna 510 is amplified by an amplifier 520. The amplified signal is split into a first modulated signal and a second modulated signal at a branch point Bo which is provided between the amplifier 520 and a squaring circuit 530. The squaring circuit 530 is a section for multiplying the first modulated signal by the second modulated signal in order to demodulate the modulated signal. That is to say, the squaring circuit 530 generates a demodulated signal as a result of the multiplication. The squaring circuit 530 supplies the demodulated signal to an amplifier 540 which then amplifies the demodulated signal and outputs the amplified signal.

In addition, the demodulator also referred to as a signal detection circuit can have another proposed typical configuration described as follows. In this proposed configuration, for example, a signal output by the signal detection circuit is compared with a reference voltage and a direct-current component of the result of the comparison is supplied to an IF (intermediate frequency) amplifier and fed back to the signal detection circuit. See, Japanese Patent Laid-open No. Sho 57-37905 (hereinafter, as Patent Document 1). In accordance with this signal detection circuit, a direct-current voltage of the detection output can be made stable.

SUMMARY OF THE INVENTION

However, the existing demodulator described above raises problems as follows. In the demodulator 600 shown in FIG. 10, the input impedance of a specific one of the two input sections of the squaring circuit 530 is different from the other one of the two input sections of the squaring circuit 530 so that, in some cases, there are amplitude and phase shifts between a first modulated signal and a second modulated signal. In such cases, there is raised a problem of a deteriorating characteristic of the demodulation performance.

In addition, in processing carried out to demodulate a signal of in a high-frequency band such as a millimeter-wave frequency band, it is generally difficult to assure sufficient isolation between the first and second modulated signals supplied to the squaring circuit 530. Thus, if the isolation is not sufficient, a signal undesirably leaks from the specific input section of the squaring circuit 530 to the other input section of the squaring circuit 530 or vice versa in some cases, inevitably affecting the characteristics of the modulated signals. As a result, there are amplitude and phase shifts between the first modulated signal and the second modulated signal as shown in FIG. 11, raising a problem of a deteriorating characteristic of the demodulation performance.

In a signal detection circuit disclosed by Patent Document 1, the DC (direct current) voltage of a detection output can be made stable by feeding back a DC component to the signal detection circuit. However, in signal detection processing carried out by a squaring circuit employed in the signal detection circuit, the input impedance of each input section of the squaring circuit varies due to changes of the DC operating point of the input section. Thus, there are amplitude and phase shifts between a first modulated signal and a second modulated signal which are supplied to their respective input sections of the squaring circuit. As a result, the signal detection characteristic deteriorates in some cases.

In order to solve the problems described above, inventor of the present invention have proposed a demodulator capable of preventing the demodulation performance from deteriorating in execution of processing to demodulate a modulated signal of a high-frequency band such as a millimeter-wave frequency band.

In order to solve the problems described above, an embodiment of the present invention provides a demodulator (such as a demodulator 30A shown in FIG. 1) employing: a splitting/matching section (such as a splitting/matching circuit 60 shown in FIG. 1 or 2) for carrying out a matching process of making the amplitude and phase of a first modulated signal match respectively the amplitude and phase of a second modulated signal; and a demodulation section (such as a squaring circuit 40 shown in FIG. 1 or 2) for generating a demodulated signal on the basis of the first modulated signal and the second modulated signal, which have been subjected to the matching process carried out by the splitting/matching section. The splitting/matching section has a splitting section (such as a branch point Bp shown in FIG. 2) for splitting a modulated signal, which has been obtained by modulating a carrier signal having a predetermined frequency on the basis of an original signal to be generated later by the demodulation section as the demodulated signal, into the first modulated signal and the second modulated signal; a first matching section (such as a first matching section 60A shown in FIG. 2) for receiving the first modulated signal from the splitting section at a first input impedance determined by first predetermined circuit-element constants of the first matching section; and a second matching section (such as a second matching section 60B shown in FIG. 2) for receiving the second modulated signal from the splitting section at a second input impedance determined by second predetermined circuit-element constants of the second matching section. The first circuit-element constants determining the first input impedance of the first matching section and the second circuit-element constants determining the second input impedance of the second matching section are set at values determined in advance in order to make the first input impedance equal to the second input impedance.

In accordance with the embodiment of the present invention, for example, a modulator carries out typically a frequency modulation by multiplying an input signal referred to as the aforementioned original signal by the carrier signal having a predetermined frequency and transmits the aforementioned modulated signal obtained as a result of the frequency modulation to the demodulator. The demodulator receives the modulated signal from the modulator. The splitting section included in the splitting/matching section employed in the demodulator splits the modulated signal into the first modulated signal and the second modulated signal. This is because, in order to generate the demodulated signal which is the aforementioned original signal, it is necessary to multiply the first modulated signal by the second demodulated signal which has a frequency synchronized with that of the first demodulated signal. In the embodiment of this present invention, the modulated signal is typically a signal having a high frequency in the millimeter-wave frequency band.

The splitting section supplies the first modulated signal to the first matching section and supplies the second modulated signal to the second matching section. In the embodiment of the present invention, the first circuit-element constants determining the first input impedance of the first matching section and the second circuit-element constants determining the second input impedance of the second matching section are set at values determined in advance in order to make the first input impedance equal to the second input impedance. Thus, the first matching section and the second matching section are capable of carrying out the matching process of making the amplitude and phase of the first modulated signal match respectively the amplitude and phase of the second modulated signal. As a result of the matching process, the amplitude and phase of the first modulated signal match respectively the amplitude and phase of the second modulated signal. The first modulated signal and the second modulated signal are supplied to their respective signal input sections employed in a squaring circuit which serves as the demodulation section. The demodulation section generates the demodulated signal based on the modulated signal by multiplying the first modulated signal by the second modulated signal having an amplitude and a phase which match respectively the amplitude and phase of the first modulated signal.

In accordance with the embodiment of the present invention, the first circuit-element constants determining the first input impedance of the first matching section employed in the splitting/matching section and the second circuit-element constants determining the second input impedance of the second matching section also employed in the splitting/matching section are set at values determined in advance in order to make the first input impedance equal to the second input impedance. Thus, the first and second modulated signals can be generated by the first and second matching sections respectively and supplied to the demodulation section provided at a stage following the splitting/matching section as two modulated signals which have mutually matching amplitudes and mutually matching phases. As a result, the demodulation performance can be prevented from deteriorating.

DETAILED DESCRIPTION OF THE PREFERRED EMBODIMENTS

Preferred embodiments of the present invention are explained in an order shown below.
1. First Embodiment (typical impedance matching following splitting of modulated signal and typical control of DC voltage correction carried out on demodulated signal)
2. Second Embodiment (typical control of other DC voltage correction carried out on demodulated signal)

1. First Embodiment

Typical Configuration of Communication Apparatus

Figure 1:
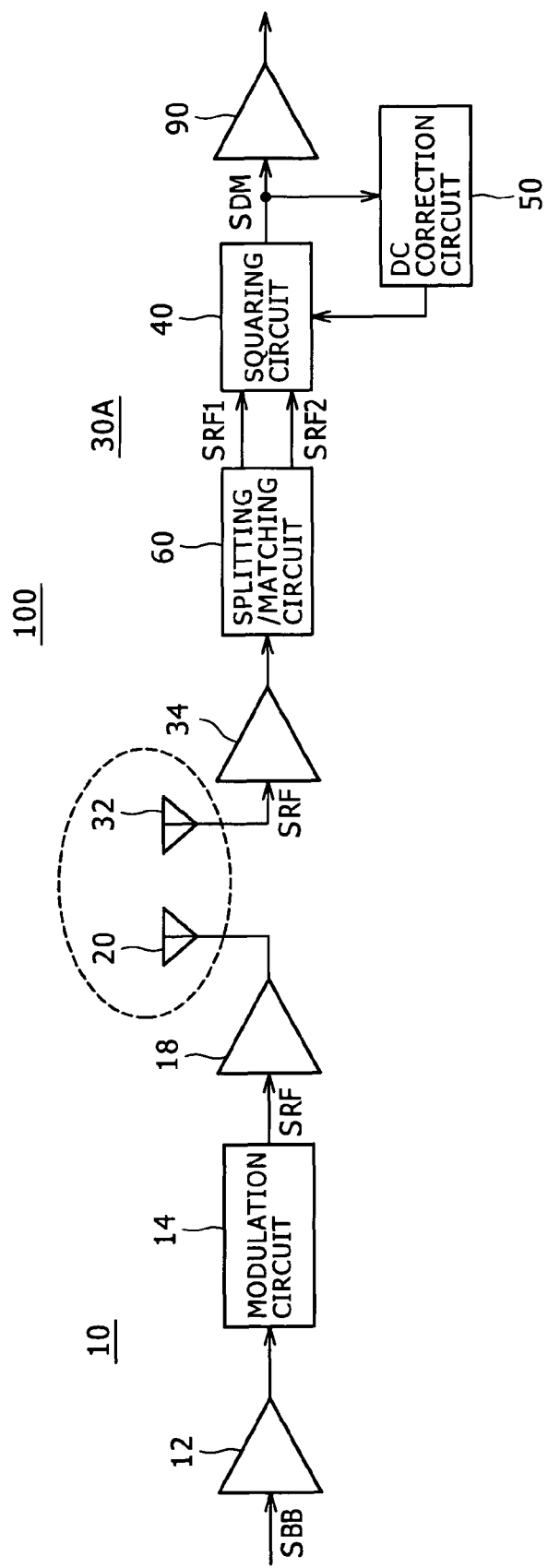
FIG. 1 is a block diagram showing a typical configuration of a communication apparatus according to a first embodiment of the present invention.

FIG. 1 is a block diagram showing a typical configuration of a communication apparatus 100 according to a first embodiment of the present invention. As shown in the figure, the communication apparatus 100 employs a modulator 10 and a demodulator 30A. In the first embodiment, high-speed communications are carried out between the modulator 10 and the demodulator 30A by making use of typically a signal in a millimeter-wave band of frequencies from 30 GHz to 300 GHz.
[Typical Configuration of Modulator]

As shown in FIG. 1, the modulator 10 employs amplifiers 12, 18, a modulation circuit 14, and an antenna 20. The amplifier 12 is a section for amplifying an input signal SBB to be used as a modulating signal and supplying the amplified signal to the modulation circuit 14. A typical example of the input signal SBB is a base-band signal. The modulation circuit 14 is a section for generating a local oscillation signal with a frequency in the millimeter-wave frequency band and multiplying the signal SBB received from the amplifier 12 to serve as a modulating signal by the local oscillation signal in order to generate a modulated signal SRF. The amplifier 18 is a section for amplifying the modulated signal SRF received from the signal modulation circuit 14 and supplying the amplified signal to the antenna 20. The antenna 20 is a section for transmitting the amplified modulated signal SRF received from the amplifier 18 to the demodulator 30A.
[Typical Configuration of Demodulator]

As shown in FIG. 1, the demodulator 30A employs an antenna 32, amplifiers 34, 90, a splitting/matching circuit 60, a squaring circuit 40, and a DC correction circuit 50. The antenna 32 is a section for receiving the modulated signal SRF transmitted by the modulator 10 and supplying the modulated signal SRF to the amplifier 34. The amplifier 34 is a section for amplifying the modulated signal SRF received from the antenna 32 and supplying the amplified signal to the splitting/matching circuit 60.

The splitting/matching circuit 60 is a section for splitting the amplified modulated signal SRF received from the amplifier 34 into a first modulated signal SRF1 and a second modulated signal SRF2 and carrying out a matching process of making the amplitude and phase of the first modulated signal SRF1 match respectively the amplitude and phase of the second modulated signal SRF2. The squaring circuit 40 supplies the first modulated signal SRF1 and the second modulated signal SRF2 which have been subjected to the matching process to the squaring circuit 40.

The squaring circuit 40 is a typical example of the so-called demodulation section. The squaring circuit 40 multiplies the first modulated signal SRF1 received from the splitting/matching circuit 60 by the second modulated signal SRF2 also received from the splitting/matching circuit 60 in order to demodulate the modulated signal SRF. The squaring circuit 40 generates a demodulated signal SDM which is the signal SBB having a frequency in a frequency band referred to as a base band cited above. The squaring circuit 40 supplies the demodulated signal SDM to the DC correction circuit 50 and the amplifier 90.

The DC correction circuit 50 is a section for extracting a DC voltage Vdc from the demodulated signal SDM supplied by the squaring circuit 40, comparing the DC voltage Vdc with a reference voltage Vref, acquiring a difference voltage based on the result of the comparison and feeding back the difference voltage to the squaring circuit 40. By feeding back the difference voltage to the squaring circuit 40, the squaring circuit 40 is capable of generating a demodulated signal SDM which has a DC voltage Vdc equal to the reference voltage Vref. In the following description, the difference voltage is also referred to as a DC offset.

The amplifier 90 is a section for amplifying the demodulated signal SDM received from the squaring circuit 40 and outputting the amplified demodulated signal SDM. Since the demodulated signal SDM generated by the squaring circuit 40 has a DC voltage Vdc which has already been corrected by the DC correction circuit 50, the amplitude of the demodulated signal SDM is prevented from being clipped even if the demodulated signal SDM is amplified by the amplifier 90.

[Typical Configuration of Splitting/Matching Circuit]

Figure 2:
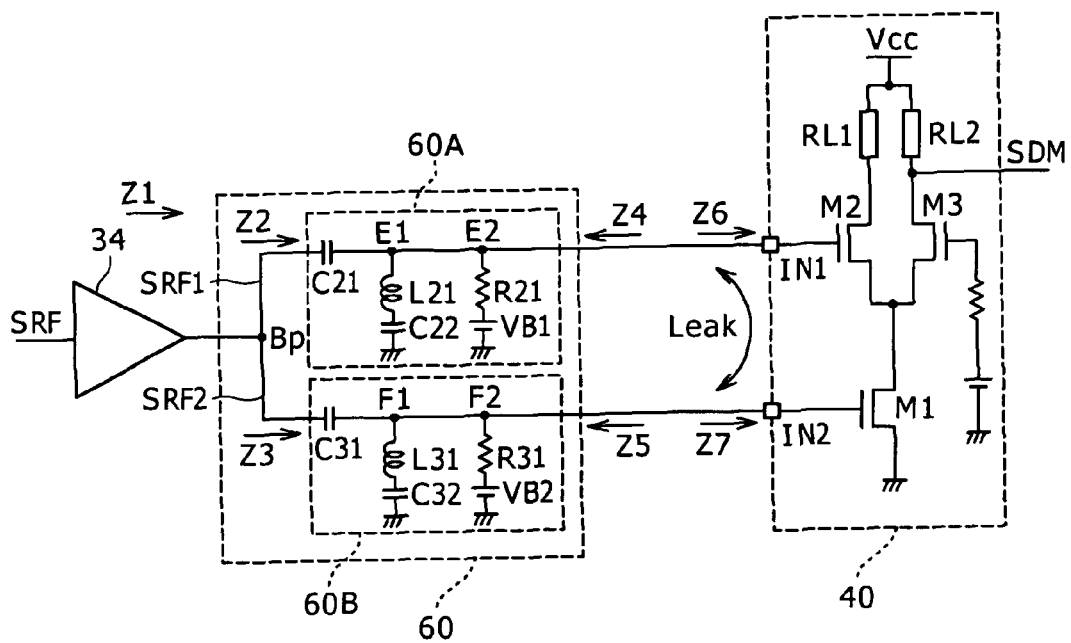
FIG. 2 is a circuit diagram showing typical configurations of a splitting/matching circuit of a demodulator.

Next, details of the splitting/matching circuit 60 are explained as follows. FIG. 2 is a circuit diagram showing a typical configuration of the splitting/matching circuit 60 and the squaring circuit 40. As shown in the figure, the splitting/matching circuit 60 includes a branch point Bp serving as a splitting section, a first matching section 60A and a second matching section 60B. The branch point Bp connects the output node of the amplifier 34 to the input node of the first matching section 60A and the input node of the second matching section 60B. That is to say, the amplifier 34 supplies the amplified modulated signal SRF to the first matching section 60A and the second matching section 60B as a first modulated signal SRF1 and a second modulated signal SRF2 respectively by way of the branch point Bp.

First of all, the first matching section 60A is explained. As shown in FIG. 2, the first matching section 60A employs capacitors C21, C22, an inductor L21, a resistor R21 and a bias power supply VB1. Each of the capacitors C21, C22, the inductor L21, the resistor R21 and the bias power supply VB1 has a circuit-element constant determined in advance. A specific one of the two nodes of the capacitor C21 is connected to the branch point Bp whereas the other one of the two nodes of the capacitor C21 is connected to the gate electrode of a transistor M2 employed in the squaring circuit 40. The gate electrode of the transistor M2 employed in the squaring circuit 40 serves as an input node IN1 of the squaring circuit 40. The capacitor C21 is an element for blocking the DC component of the first modulated signal SRF1 which propagates from the branch point Bp. It is to be noted that the capacitor C21 is a typical capacitor employed in the first matching section 60A to serve as a first capacitor according to an embodiment of the present invention whereas the capacitor C22 is a typical capacitor employed in the first matching section 60A to serve as a second capacitor according to the embodiment of the present invention.

A specific one of the two nodes of the inductor L21 is connected to a connection point E1 which connects the capacitor C21 to the gate electrode of the transistor M2 employed in the squaring circuit 40 whereas the other one of the two nodes of the inductor L21 is connected to the capacitor C22. A specific one of the two nodes of the capacitor C22 is connected to the inductor L21 whereas the other one of the two nodes of the capacitor C22 is connected to the ground. The inductor L21 and the capacitor C22 compose a matching circuit. The ratio of the capacitance of the capacitor C21 to the capacitance of the capacitor C22 is adjusted to a proper value for achieving a matching state between the input impedance Z1 of the splitting/matching circuit 60 and the input impedance Z2 of the first matching section 60A. A specific one of the two nodes of the resistor R21 is connected to a connection point E2 which connects the capacitor C21 to the gate electrode of the transistor M2 employed in the squaring circuit 40 whereas the other one of the two nodes of the resistor R21 is connected to the ground through the bias power supply VB1. A voltage generated by the bias power supply VB1 is set at the same level as a voltage appearing at the gate electrode of the transistor M2 employed in the squaring circuit 40. It is to be noted that the connection point E1 is a typical connection point included in the first matching section 60A to serve as a first connection point according to the embodiment of the present invention whereas the connection point E2 is a typical connection point included in the first matching section 60A to serve as a second connection point according to the embodiment of the present invention.

Next, the second matching section 60B is explained. As shown in FIG. 2, the second matching section 60B has a same configuration as the configuration of the first matching section 60A. Concretely, the second matching section 60B employs capacitors C31, C32, an inductor L31, a resistor R31 and a bias power supply VB2. Each of the capacitors C31, C32, the inductor L31, the resistor R31 and the bias power supply VB2 has a circuit-element constant determined in advance. A specific one of the two nodes of the capacitor C31 is connected to the branch point Bp whereas the other one of the two nodes of the capacitor C31 is connected to the gate electrode of a transistor M1 employed in the squaring circuit 40. The gate electrode of the transistor M1 employed in the squaring circuit 40 serves as an input node IN2 of the squaring circuit 40. The capacitor C31 is an element for blocking the DC component of the second modulated signal SRF2 which propagates from the branch point Bp. It is to be noted that the capacitor C31 is a typical capacitor employed in the second matching section 60B to serve as a first capacitor according to the embodiment of the present invention whereas the capacitor C32 is a typical capacitor employed in the second matching section 60B to serve as a second capacitor according to the embodiment of the present invention.

A specific one of the two nodes of the inductor L31 is connected to a connection point F1 which connects the capacitor C31 to the gate electrode of the transistor M1 employed in the squaring circuit 40 whereas the other one of the two nodes of the inductor L31 is connected to the capacitor C32. A specific one of the two nodes of the capacitor C32 is connected to the inductor L31 whereas the other one of the two nodes of the capacitor C32 is connected to the ground. The inductor L31 and the capacitor C32 compose a matching circuit. The ratio of the capacitance of the capacitor C31 to the capacitance of the capacitor C32 is adjusted to a proper value for achieving a matching state between the input impedance Z1 of the splitting/matching circuit 60 and the input impedance Z3 of the second matching section 60B. A specific one of the two nodes of the resistor R31 is connected to a connection point F2 which connects the capacitor C31 to the gate electrode of the transistor M1 employed in the squaring circuit 40 whereas the other one of the two nodes of the resistor R31 is connected to the ground through the bias power supply VB2. A voltage generated by the bias power supply VB2 is set at the same level as a voltage appearing at the gate electrode of the transistor M1 employed in the squaring circuit 40. It is to be noted that the connection point F1 is a typical connection point included in the second matching section 60B to serve as a first connection point according to the embodiment of the present invention whereas the connection point F2 is a typical connection point included in the second matching section 60B to serve as a second connection point according to the embodiment of the present invention.

[Typical Operations of Splitting/Matching Circuit]

In such a configuration of the splitting/matching circuit 60, the amplified modulated signal SRF received from the amplifier 34 is split into a first modulated signal SRF1 and a second modulated signal SRF2 at the branch point Bp. The first modulated signal SRF1 serving as a specific one of the two split modulated signals is supplied to the first matching section 60A whereas the second modulated signal SRF2 serving as the other one of the two split modulated signals is supplied to the second matching section 60B. In the first matching section 60A, the capacitor C21 blocks the DC component of the first modulated signal SRF1 supplied to the first matching section 60A. A predetermined DC voltage V2 generated by the bias power supply VB1 is applied to the first modulated signal SRF1 from which the DC component has been removed by the capacitor C21. Then, the first modulated signal SRF1 with the DC bias voltage V2 applied thereto is supplied to the gate electrode of the transistor M2 employed in the squaring circuit 40. The LC circuit composed of the capacitor C22 and the inductor L21 passes only components included in the first modulated signal SRF1 as components which each have a frequency in a specific frequency band.

By the same token, in the second matching section 60B, the capacitor C31 blocks the DC component of the second modulated signal SRF2 supplied to the second matching section 60B. A predetermined DC voltage V1 generated by the bias power supply VB2 is applied to the second modulated signal SRF2 from which the DC component has been removed by the capacitor C31. Then, the second modulated signal SRF2 with the DC bias voltage V1 applied thereto is supplied to the gate electrode of the transistor M1 employed in the squaring circuit 40.

[Input Impedances of Splitting/Matching Circuit]

In the first embodiment, an input impedance Z2 shown in FIG. 2 is an input impedance seen from the input side of the first matching section 60A. The input impedance Z2 is determined by the circuit-element constants of the capacitors C21, C22, the inductor L21, the resistor R21 and the bias power supply VB1 which are employed in the first matching section 60A. In addition, the input impedance Z2 also includes an input impedance Z6 seen from the side of the transistor M2 employed in the squaring circuit 40. The input impedance Z6 of the squaring circuit 40 is an input impedance seen from an input node IN1 of the squaring circuit 40. The input impedance Z2 is expressed by Equations (1) and (2).

By the same token, in the first embodiment, an input impedance Z3 shown in FIG. 2 is an input impedance seen from the input side of the second matching section 60B. The input impedance Z2 is determined by the circuit-element constants of the capacitors C31, C32, the inductor L31, the resistor R31 and the bias power supply VB2 which are employed in the second matching section 60B. In addition, the input impedance Z3 also includes an input impedance Z7 seen from the side of the transistor M1 employed in the squaring circuit 40. The input impedance Z7 of the squaring circuit 40 is an input impedance seen from an input node IN2 of the squaring circuit 40.

Since the input impedance Z2 of the first matching section 60A and the input impedance Z3 of the second matching section 60B are determined by the circuit-element values of the components composing respectively the first matching section 60A and the second matching section 60B as described above, the circuit-element values are adjusted so that the input impedance Z2 of the first matching section 60A becomes equal to the input impedance Z3 of the second matching section 60B. That is to say, the circuit-element constants of the components are set at such values that the input impedance Z2 of the first matching section 60A becomes equal to the input impedance Z3 of the second matching section 60B. It is thus possible to achieve a matching state in which the amplitude and phase of the first modulated signal SRF1 supplied to the first matching section 60A are the same as respectively the amplitude and phase of the second modulated signal SRF2 supplied to the second matching section 60B. It is to be noted that a design condition of every component employed in the splitting/matching circuit 60 will be described later.

[Output Impedances of Splitting/Matching Circuit]

In the first embodiment, an output impedance Z4 shown in FIG. 2 is an output impedance seen from the output side of the first matching section 60A. The output impedance Z4 is determined by the circuit-element constants of the capacitors C21, C22, the inductor L21, the resistor R21 and the bias power supply VB1 which are employed in the first matching section 60A. In addition, the output impedance Z4 also includes the input impedance Z3 of the second matching section 60B and the output impedance Z0 of the amplifier 34. The input impedance Z2 is expressed by Equation (4).

By the same token, in the first embodiment, an output impedance Z5 shown in FIG. 2 is an output impedance seen from the output side of the second matching section 60B. The output impedance Z5 is determined by the circuit-element constants of the capacitors C31, C32, the inductor L31, the resistor R31 and the bias power supply VB2 which are employed in the second matching section 60B. In addition, the output impedance Z5 also includes the input impedance Z2 of the first matching section 60A and the output impedance Z0 of the amplifier 34. The output impedance Z5 is expressed by Equation (5).

Since the output impedance Z4 of the first matching section 60A and the output impedance Z5 of the second matching section 60B are defined in terms of circuit-element constants of the components composing the first matching section 60A and the second matching section 60B as described above, for example, a voltage leaking from the transistor M1 to the transistor M2 can be approximated by a fraction of a current signal which is supplied to the transistor M1. As shown in Equation (3), the magnitude of the fraction of the signal current is determined by division (Z4/(Z4+Z6)) which involves the input impedance Z6 and the output impedance Z4 on the side opposite to the input impedance Z6. In this case, the input impedance Z6 of the squaring circuit 40 is an input impedance seen from the input node IN1 of the transistor M2 employed in the squaring circuit 40. Thus, in the first embodiment, by making the output impedance Z4 smaller than the input impedance Z6, it is possible to suppress the voltage which leaks from the transistor M1 to the transistor M2. It is to be noted that the input node IN1 is a typical example of a first input section according to the embodiment of the present invention.

By the same token, by making the output impedance Z5 smaller than the input impedance Z7, it is possible to suppress a voltage which leaks from the transistor M2 to the transistor M1. In this case, the input impedance Z7 of the squaring circuit 40 is an input impedance seen from the input node IN2 of the transistor M1 employed in the squaring circuit 40. The output impedance Z4 and the output impedance Z5 are adjusted by properly setting the circuit-element constants of the components which compose the first matching section 60A and the second matching section 60B. It is to be noted that the input node IN2 is a typical example of a second input section according to the embodiment of the present invention.

[Method for Setting Circuit Constants of Splitting/Matching Circuit]

Next, design conditions of the splitting/matching circuit 60 are explained. For example, let the output impedance Z0 of the amplifier 34 be already set at 50 ohms (that is, Z0=50Ω). In this case, the input impedance Z1 exhibited by the splitting/matching circuit 60 against the modulated signal SRF prior to the splitting of the modulated signal SRF is also set at 50 ohms (that is, Z1=50Ω) in order to establish a state in which the input impedance Z1 of, the splitting/matching circuit 60 matches the output impedance Z0 of the amplifier 34. In addition, the input impedance Z2 and the input impedance Z3 are set at a common value which is 100 ohms in this case (that is, Z2=Z3=100Ω). As described above, the input impedance Z2 is an input impedance exhibited by the first matching section 60A against the first modulated signal SRF1 obtained as a result of the splitting of the modulated signal SRF at the branch point Bp whereas the input impedance Z3 is an input impedance exhibited by the second matching section 60B against the second modulated signal SRF2 which is obtained as a result of the splitting of the modulated signal SRF at the branch point Bp. By setting the input impedance Z2 and the input impedance Z3 at the same value as described above, it is possible to achieve a matching state in which the amplitude and phase of the first modulated signal SRF1 supplied to the first matching section 60A can be made the same as respectively the amplitude and phase of the second modulated signal SRF2 supplied to the second matching section 60B.

The following description explains conditions for setting the circuit-element constants of the components employed in the first matching section 60A on the assumption that the input impedance Z2 of the first matching section 60A has been set at 100 ohms (that is, Z2=100Ω). It is to be noted that, since the second matching section 60B has a same circuit configuration as the circuit configuration of the first matching section 60A, description explaining conditions for setting the circuit-element constants of the components employed in the second matching section 60B is omitted in order to avoid duplications of explanations.

Figure 3:
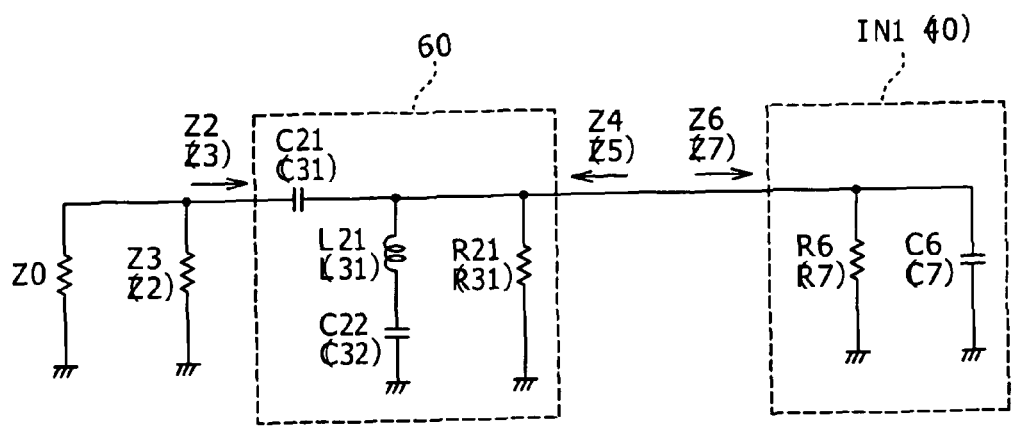
FIG. 3 is a circuit diagram showing a first typical equivalent circuit of a matching section employed in the splitting/matching circuit.

FIG. 3 is a circuit diagram showing a first typical equivalent circuit of the first (or second) matching section 60A (or 60B) employed in the splitting/matching circuit 60 and the demodulation section 40 which is also referred to as a squaring circuit 40. As shown in the figure, the input impedance Z6 of the squaring circuit 40 is the input impedance of an equivalent circuit including a resistor. R6 and a capacitor C6 which are connected to each other in parallel to each other. For Z0=50Ω and Z2=100Ω, the resistance of the resistor R6 can be set at a typical value of 2.5 kilo-ohms (that is, R6=2.5 kW whereas the capacitance of the capacitor C6 can be set at a typical value of 16 fF (that is, C6=16 fF).

Figure 4:
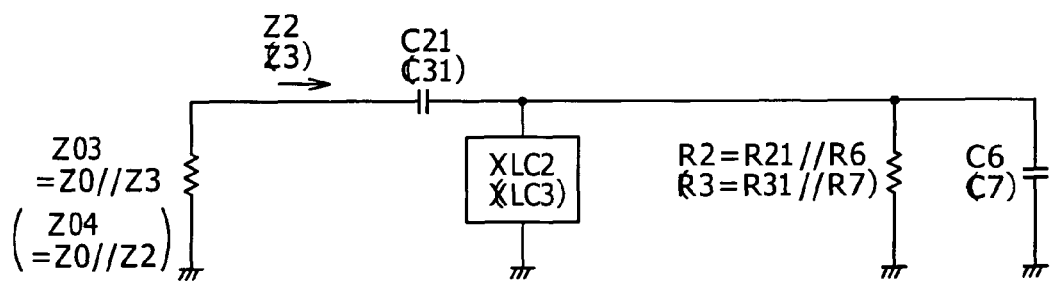
FIG. 4 is a circuit diagram showing a second typical equivalent circuit of the matching section employed in the splitting/matching circuit.

FIG. 4 is a circuit diagram showing a second typical equivalent circuit of the first (or second) matching section 60A (or 60B) employed in the splitting/matching circuit 60 and the demodulation section 40 which is also referred to as a squaring circuit 40. As shown in this figure, a resistor R2 is used in place of a resistor R21 and the resistor R6 which are connected to each other in parallel to each other in the first typical equivalent circuit shown in FIG. 3. In FIG. 4, notation R2=R21//R6 shown indicates that the resistor R2 is used in place of a resistor R21 and the resistor R6 which are connected to each other in parallel to each other in the first typical equivalent circuit shown in FIG. 3. A reactance XLC2 represents an inductor L21 and a capacitor C22 which are connected to each other in series in the first typical equivalent circuit shown in FIG. 3. Taking the circuit layout area into consideration, for the reactance XLC2, the inductance of the inductor L21 is set at a value not greater than 350 pH (that is, L21≦350 pH) whereas the capacitance of the capacitor C22 is set at a value which is not greater than 300 fF (that is, C22≦300 fF).

The input impedance Z2 of the first typical equivalent circuit shown in FIG. 3 is expressed by Equation (1) given below. Equation (2) also expresses the input impedance Z2. However, the expression on the right-hand side of Equation (2) is obtained from the expression on the right-hand side of Equation (1) by separating the real and imaginary parts from each other.

$$z2 = \cfrac{1}{j\omega C6 + \cfrac{1}{R2} + \cfrac{1}{jXLC2}} - j\cfrac{1}{\omega C21} \qquad (1)$$

$$= \cfrac{R2^2 \times LC2^2}{R2^2(1 - \omega C6 \times LC2)^2 + XLC2^2} + j\left(\cfrac{R2^2 \times LC2(1 - \omega C6 \times LC2)}{R2^2(1 - \omega C6 \times LC2)^2 + XLC2^2} - \cfrac{1}{\omega C21}\right) \qquad (2)$$

The first term of the expression on the right-hand side of Equation (2) is the real part of the input impedance Z2. Thus, in order to obtain the real part having a value of 100 (that is, Z2=100Ω), it is necessary to impose a condition requiring that the resistance of the resistor R2 be set at a value not smaller than 100 ohms (that is, R2≧100). By setting the resistance of the resistor R2 in the first term of the expression on the right-hand side of Equation (2) at such a value, circuit-element constants for the reactance XLC2 can be determined. The second term of the expression on the right-hand side of Equation (2) is the imaginary part of the input impedance Z2. Thus, since the second term of the expression on the right-hand side of Equation (2) has a value of 0, the circuit-element constant (that is, the capacitance) of the capacitor C21 can also be determined.

As described above, in order to obtain the first term having a value of 100 (that is, Z2=100Ω), it is necessary to set the resistance of the resistor R2 at a value not smaller than 100 ohms (that is, R2≧100). It is obvious from the first term of the expression on the right-hand side of Equation (2) that, by setting the resistance of the resistor R2 (or the resistor R21) at a large value, each of the capacitance of the capacitor C21 and the reactance XLC2 can be set at a small value so that the circuit size can be reduced. At the same time, however, impedance variations caused by frequency changes undesirably increase. Thus, in order to avoid the undesirable impedance variations caused by frequency changes, in the first embodiment, the circuit-element constants of the first matching section 60A are set at optimum values as follows: R21=110Ω, C21=120 fF, L21=350 pH and C22=300 fF. By setting the circuit-element constants of the first matching section 60A at such optimum values, the input impedance Z2 of the first matching section 60A can be set at 100 ohms (that is, Z2=100Ω).

By the same token, for Z0=50Ω and Z3=100Ω, the resistance of a resistor R7 can be set at a typical value of 5 kilo-ohms (that is, R7=5 kW whereas the capacitance of a capacitor C7 can be set at a typical value of 20 fF (that is, C7=20 fF). Then, by following the same procedure as the first matching section 60A, the circuit-element constants of the second matching section 60B are set at optimum values as follows: R31=107Ω, C31=120 fF, L31=300 pH and C32=300 fF. It is to be noted that the circuit elements R7, C7, R31, C31, L31 and C32 of the second matching section 60B are denoted by respectively notations R7, C7, R31, C31, L31 and C32 each enclosed in parentheses in FIGS. 3 and 4. By setting the circuit-element constants of the second matching section 60B at such optimum values, the input impedance Z3 of the second matching section 60B can be set at 100 ohms (that is, Z3=100Ω). That is to say, the input impedance Z3 of the second matching section 60B can be set at the same value at which the input impedance Z2 of the first matching section 60A is set (that is, Z2=100Ω).

The following description explains computation of a leak caused by the splitting/matching circuit 60 with circuit-element constants thereof determined as described above as a leak between the two input nodes IN1 and IN2 of the squaring circuit 40. As shown in FIG. 2, a leak current flows from a specific one of the two input nodes IN1 and IN2 of the squaring circuit 40 to the other one of the two input nodes IN1 and IN2 of the squaring circuit 40. The specific input node of the squaring circuit 40 is the input node IN2 connected to the gate electrode of the transistor M1 employed in the squaring circuit 40 whereas the other input node of the squaring circuit 40 is the input node IN1 connected to the gate electrode of the transistor M2 which is also employed in the squaring circuit 40. In the following description, the leak current is denoted by notation VLeak@IN1. The leak current VLeak@IN1 is expressed by approximation based on Equation (3) given below. That is to say, the leak current VLeak@IN1 flowing from the transistor M1 to the transistor M2 can be approximated by a fraction of a signal current which is supplied to the transistor M1. As shown in Equation (3), the magnitude of the fraction of the current signal is determined by division (Z4/(Z4+Z6)) which involves the output impedance Z4 and the input impedance Z6. It is to be noted that, in Equation (3), notation VIN2 denotes the amplitude of a voltage applied to the gate electrode of the transistor M1 whereas notation gm1 denotes the mutual conductance of the transistor M1. In this case, the mutual conductance gm1 of the transistor M1 is 10 mA/V.

$$VLeak@IN1 = -\frac{Z4}{Z4+Z6}gm1 VIN2 \quad (3)$$

Figure 5:
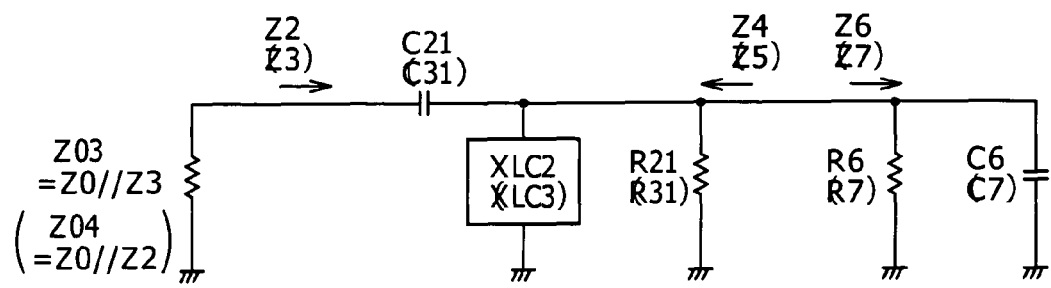
FIG. 5 is a circuit diagram showing a third typical equivalent circuit of the matching section employed in the splitting/matching circuit.

The output impedance Z4 of the splitting/matching circuit 60 is expressed by Equation (4) given below. In Equation (4), the reactance XLC2 is a reactance shown in FIGS. 4 and 5 to represent an inductor L21 and a capacitor C22 which are connected to each other in series.

$$Z4 = \frac{1}{\frac{1}{Z03+\frac{1}{j\omega C21}} + \frac{1}{XLC2} + \frac{1}{R21}} \quad (4)$$

The input impedance Z6 (=R6//C6) has a known value. Notation Z6 (=R6//C6) indicates that the input impedance Z6 represents the resistance of a resistor R6 and the capacitance a capacitor C6 connected to the resistor R6 in parallel to the resistor R6. To put it more concretely, the resistance of the resistor R6 is 2.5 kilo-ohms (that is, R6=2.5 kW whereas the capacitance of the capacitor C6 is 16 fF (that is, C6=16 fF). Thus, the output impedance Z4 can be computed from Equation (4). Then, by substituting the computed output impedance Z4 and the known input impedance Z6 into Equation (3), the leak current VLeak@IN1 flowing from the input node IN2 to the input node IN1 can be found to be 0.002. That is to say, it is obvious that the leak voltage can be suppressed to a value which is not greater than −50 dB.

In the same way as the procedure for finding the leak current VLeak@IN1 flowing from the input node IN2 of the squaring circuit 40 to the input node IN1 of the squaring circuit 40, it is also possible to compute the leak current VLeak@IN2 flowing from the input node IN1 to the input node IN2. In the same way as the expression of the output impedance Z4 of the first matching section 60A, the output impedance Z5 of the second matching section 60B is expressed by Equation (5) given as follows.

$$Z5 = \frac{1}{\frac{1}{Z04+\frac{1}{j\omega C31}} + \frac{1}{XLC3} + \frac{1}{R31}} \quad (5)$$

In the same way as the expression of the leak current VLeak@IN1, the leak current VLeak@IN2 is expressed by approximation based on Equation (6) given below. That is to say, the leak current VLeak@IN2 flowing from the transistor M2 to the transistor M1 can be approximated by a fraction of a signal current which is supplied to the transistor M2. As shown in Equation (6), the magnitude of the fraction of the current signal is determined by division (Z5/(Z5+Z7)) which involves the output impedance Z5 and the input impedance Z7. It is to be noted that, in Equation (6), notation VIN1 denotes the amplitude of a voltage applied to the gate electrode of the transistor M2 whereas notation gm2 denotes the mutual conductance of the transistor M2. In this case, the mutual conductance gm2 of the transistor M2 is 3 mA/V.

$$VLeak@IN2 = -\frac{Z5}{Z5+Z7}gm2 VIN1 \quad (6)$$

Then, by substituting the output impedance Z5 computed in accordance with Equation (5) and the known input impedance Z7 into Equation (6), the leak current VLeak@IN2 flowing from the input node IN1 to the input node IN2 can be found to be 0.001. That is to say, it is obvious that the leak voltage can be suppressed to a value which is not greater than −50 dB. As described above, in accordance with the first embodiment, each of the output impedances Z4 and Z5 of the splitting/matching circuit 60 can be set at a proper value so that the leak currents flowing from the specific input node of the squaring circuit 40 to the other input node of the squaring circuit 40 and vice versa can be suppressed.

[Problems Raised by Existing Squaring Circuit]

Next, details of the squaring circuit 40 are explained as follows. First of all, problems raised by the existing squaring circuit are enlightened. As described earlier, the squaring circuit is a circuit for multiplying two component modulated signals of a modulated signal received from a modulator by each other in order to generate a demodulated signal from the modulated signal. The two component modulated signals are signals obtained by splitting the modulated signal. In the process carried out by the squaring circuit to multiply the two component modulated signals by each other, a rectified component obtained as a result of rectification of the carrier component included in the modulated signal appears as a DC voltage as shown in Equation (7) given below:

$$A\cos\omega I \times A\cos\omega I = \frac{A^2(\cos 2\omega I + 1)}{2} \quad (7)$$

Figure 6A:
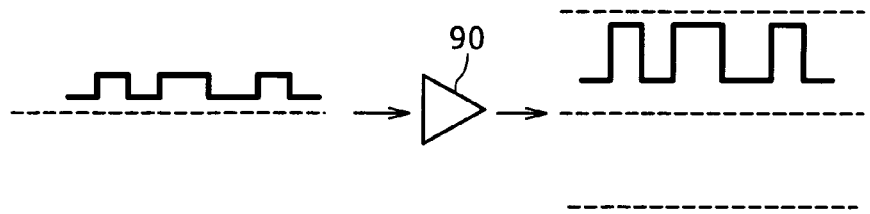
FIGS. 6A to 6C are diagrams showing the waveforms of demodulated signal with or without DC (direct current) correction carried out.
Figure 6B:
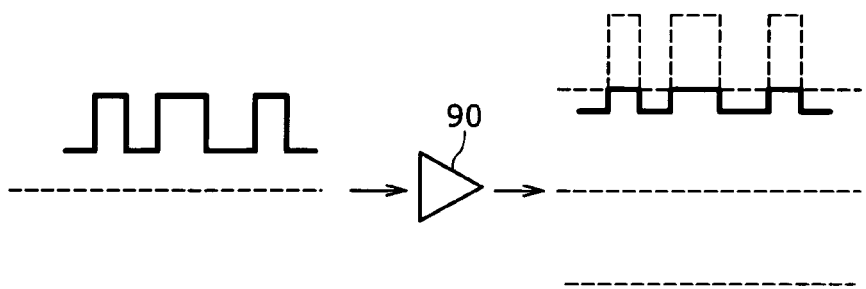

A demodulated signal SDM generated by the squaring circuit 40 as a signal including the DC voltage also referred to as a DC offset is amplified at a high gain by the amplifier 90 as shown in FIG. 6. If the demodulated signal serving as an input to the amplifier 90 is weak, the amplifier 90 amplifies the demodulated signal without clipping the amplitude of the amplified signal as shown in FIG. 6A. If the demodulated signal serving as an input to the amplifier 90 is strong, on the other hand, the amplifier 90 amplifies the demodulated signal by inadvertently clipping the amplitude of the amplified signal as shown in FIG. 6B. In this case, the amplitude of the amplified signal may not be adequate. As a result, the demodulator raises a problem that the performance to isolate the digital demodulated signal undesirably deteriorates. In order to solve this problem, the first embodiment is provided with the DC correction circuit 50 for generating a DC adjustment voltage Vadj based on the difference between the DC voltage Vdc included in the demodulated signal SDM, which has been generated by the squaring circuit 40 as a signal having a frequency in the base band, and a reference voltage Vref. The DC correction circuit 50 feeds the DC adjustment voltage Vadj back to the squaring circuit 40 to serve as a voltage for adjusting the DC voltage Vdc in the so-called DC correction process. By adjusting the DC voltage Vdc prior to amplification of the demodulated signal SDM in the amplifier 90 in this way, it is possible to prevent the amplitude of the amplified signal from being clipped in the amplification carried out by the amplifier 90 to amplify the demodulated signal SDM.

[Typical Configurations of Squaring Circuit and DC Correction Circuit]

Figure 7:
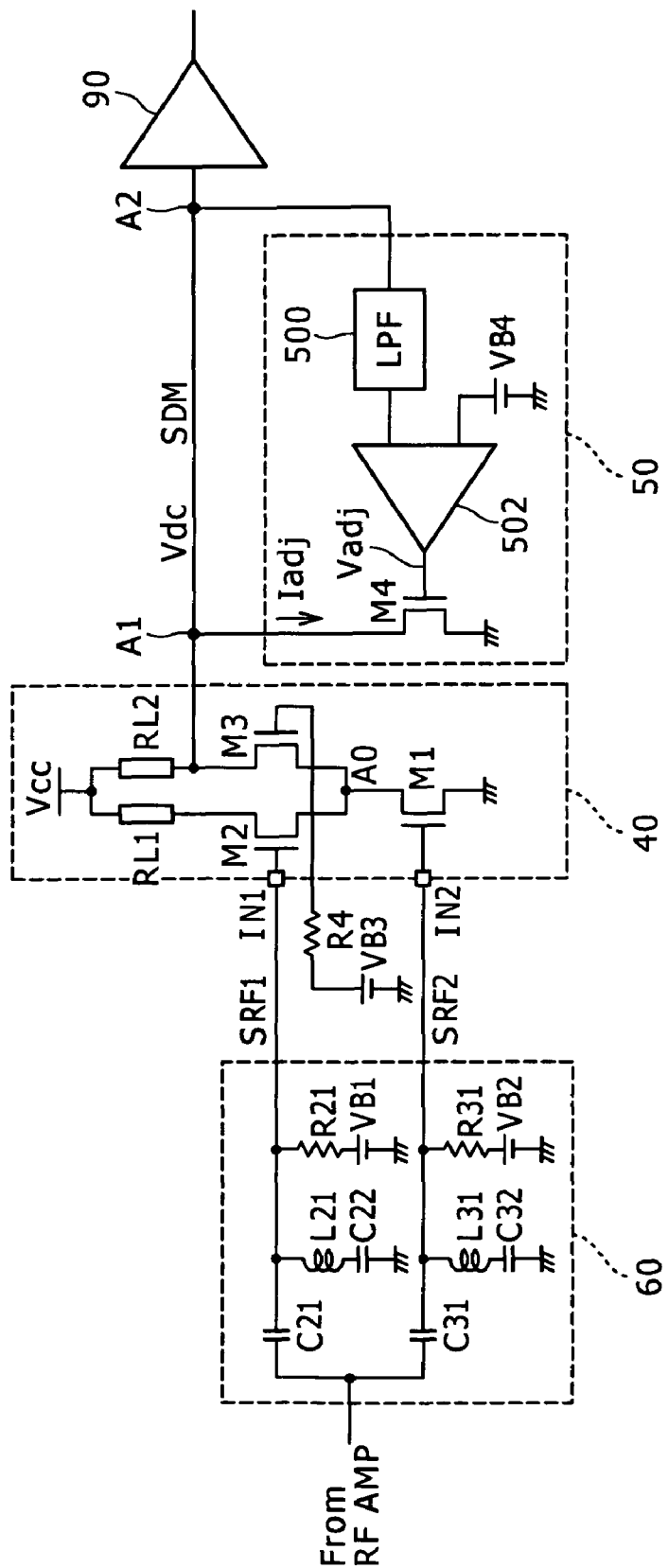
FIG. 7 is a circuit diagram showing typical configurations of the splitting/matching circuit, a squaring circuit and a DC correction circuit.

FIG. 7 is a circuit diagram showing typical configurations of the splitting/matching circuit 60, the squaring circuit 40 and the DC correction circuit 50 which are employed in the demodulator 30A. Referring to the figure, the following description explains the squaring circuit 40 and the DC correction circuit 50 which are provided in accordance with the first embodiment of the present invention. As shown in the circuit diagram, the squaring circuit 40 is configured to employ transistors M2 and M3 serving as a differential pair circuit, a transistor M1 and load resistors RL1 and RL2. In the first embodiment, each of the transistors M1, M2 and M3 is a MOSFET (metal-oxide-semiconductor field-effect transistor). In addition, the transistor M2 is a typical example of a first transistor provided by the embodiment of the present invention whereas the transistor M1 is a typical example of a second transistor provided by the embodiment of the present invention.

The drain electrode of the transistor M2 is connected to a specific one of the two ends of the load resistor RL1 whereas the gate electrode of the transistor M2 is connected to the input node IN1 which is wired to the first matching section 60A. The drain electrode of the transistor M3 is connected to a specific one of the two ends of the load resistor RL2 whereas the gate electrode of the transistor M3 is connected to a specific one of the two nodes of a bias power supply VB3 through a resistor R4. The bias power supply VB3 generates an electric potential at a level equal to that of an electric potential generated by the bias power supply VB1. The other one of the two nodes of the bias power supply VB3 is connected to the ground. The source electrodes of the transistor M2 and the transistor M3 are connected to a common connection point A0 which is wired to the drain electrode of the transistor M1. The transistor M2 and the transistor M3 form a differential pair circuit. The other one of the two ends of the load resistor RL1 and the other one of the two ends of the load resistor RL2 are connected to a power supply Vcc which generates a high electric potential.

As described above, the drain electrode of the transistor M1 is connected to the source electrodes of the transistor M2 and the transistor M3 through the common connection point A0 whereas the gate electrode of the transistor M1 is connected to the input node IN2 which is wired to the second matching section 60B. The source electrode of the transistor M1 is connected to the ground. The ground is a typical example of a power supply provided by the embodiment of the present invention to serve as a power supply for generating a low electric potential.

Next, the DC correction circuit 50 is explained as follows. As shown in FIG. 7, the DC correction circuit 50 is configured to employ a low-pass filter 500, a comparator 502, a power supply VB4 and a transistor M4. The comparator 502 is a typical example of a comparison section according to the embodiment of the present invention whereas the power supply VB4 is a power supply for generating a reference electric potential Vref. The input node of the low-pass filter 500 is connected to a connection point A2 which is wired to the output node of the squaring circuit 40 and the input node of the amplifier 90. The output node of the low-pass filter 500 is connected to a specific one of the two input nodes of the comparator 502. The low-pass filter 500 is a section for supplying the demodulated signal SDM to the comparator 502 before the demodulated signal SDM is amplified by the amplifier 90. The other one of the two input nodes of the comparator 502 is connected to the ground through the power supply VB4. The drain electrode of the transistor M4 is connected to a connection point A1 which is also wired to the output node of the squaring circuit 40 and the input node of the amplifier 90. The output node of the squaring circuit 40 is connected to the aforementioned specific end of the load resistor RL2. The gate electrode of the transistor M4 is connected to the output node of the comparator 502 whereas the source electrode of the transistor M4 is connected to the ground.

[Typical Operations of Squaring Circuit and DC Correction Circuit]

The following description explains typical operations carried out by the squaring circuit 40 and the DC correction circuit 50. The gate electrode of the transistor M2 employed in the squaring circuit 40 is connected to the input node IN1 which receives the first modulated signal SRF1 output by the first matching section 60A included in the splitting/matching circuit 60. The first modulated signal SRF1 has been subjected to a matching process carried out by the first matching section 60A in order to eliminate shifts of the amplitude and phase of the first modulated signal SRF1 from respectively the amplitude and phase of the second modulated signal SRF2 output by the second matching section 60B included in the splitting/matching circuit 60. In addition, a DC bias voltage V1 generated by the bias power supply VB1 has been applied to the first modulated signal SRF1.

On the other hand, the gate electrode of the transistor M1 employed in the squaring circuit 40 is connected to the input node IN2 which receives the second modulated signal SRF2 output by the second matching section 60B included in the splitting/matching circuit 60. By the same token, the second modulated signal SRF2 has been subjected to a matching process carried out by the second matching section 60B in order to eliminate shifts of the amplitude and phase of the second modulated signal SRF2 from respectively the amplitude and phase of the first modulated signal SRF1 output by the first matching section 60A included in the splitting/matching circuit 60. In addition, a DC bias voltage V2 generated by the bias power supply VB2 has been applied to the second modulated signal SRF2.

The squaring circuit 40 multiplies the first modulated signal SRF1 appearing at the input node IN1 by the second modulated signal SRF2 appearing at the input node IN2 in order to generate the demodulated signal SDM based on the modulated signal SRF. The squaring circuit 40 outputs the demodulated signal SDM to the DC correction circuit 50 and the amplifier 90 by way of the specific end of the load resistor RL2. The demodulated signal SDM includes a DC component generated as a result of multiplication expressed by Equation (7). The DC component is the DC voltage Vdc mentioned before.

The low-pass filter 500 employed in the DC correction circuit 50 fetches the demodulated signal SDM, which is output by the squaring circuit 40, through the connection point A2 and eliminates modulated and modulating signal components from the fetched demodulated signal SDM. Thus, the low-pass filter 500 passed on only the DC component which is referred to as the DC voltage Vdc of the demodulated signal SDM. The low-pass filter 500 supplies the passed-on DC voltage Vdc of the demodulated signal SDM to the comparator 502.

The comparator 502 is a section for comparing the DC voltage Vdc received from the low-pass filter 500 with the reference voltage Vref generated by the power supply VB4 and outputting a difference voltage obtained as a result of the comparison. The comparator 502 then supplies the difference voltage to the gate electrode of the transistor M4 as a variable DC offset. As will be described later, the DC offset is also referred to as the DC adjustment voltage Vadj cited before. The variable DC offset causes a drain current Iadj flowing through the transistor M4 to change. The drain current Iadj is fed back to the output node of the squaring circuit 40 as a current which changes in accordance with variations in DC offset.

The drain current Iadj fed back from the DC correction circuit 50 to the output node of the squaring circuit 40 varies, causing the magnitude of a voltage drop along the load resistor RL2 also to vary as well. The drain current Iadj, the DC adjustment voltage Vadj and the resistance of the load resistor RL2 satisfy a relation expressed quantitatively by Equation (8) given below. As described above, the DC adjustment voltage Vadj is a voltage used for adjusting the DC voltage Vdc to the reference voltage Vref. The DC adjustment voltage Vadj is a voltage generated in accordance with a DC offset (that is, a DC difference) between the DC voltage Vdc and the reference voltage Vref.

$$Vadj = RL2 \times Iadj \quad (8)$$

Figure 6C:
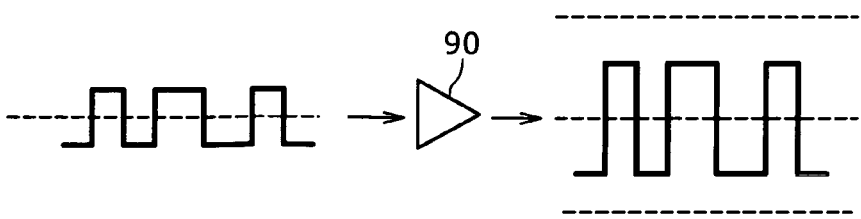

In the above equation, the expression RL2×Iadj expresses the magnitude of the voltage drop along the load resistor RL2. If the drain current Iadj increases, the magnitude of the voltage drop along the load resistor RL2 also increases, changing the DC adjustment voltage Vadj as is obvious from the above equation. Thus, the DC voltage Vdc of the demodulated signal SDM can be adjusted to the reference voltage Vref in a voltage correction process. In this way, the drain current Iadj is controlled automatically in order to adjust the magnitude of the DC offset representing the difference between the DC voltage Vdc of the demodulated signal SDM output by the squaring circuit 40 and the reference voltage Vref at zero. That is to say, the DC offset representing the difference between the reference voltage Vref and the DC voltage Vdc caused by the signal multiplication process carried out by the squaring circuit 40 can be suppressed to zero. As a result, even if the demodulated signal SDM is amplified by the amplifier 90 provided at a stage following the squaring circuit 40, it is possible to prevent the magnitude of the amplified demodulated signal SDM from being clipped as shown in FIG. 6C.

As described above, in the first embodiment, the input impedance Z2 of the first matching section 60A employed in the splitting/matching circuit 60 is set at a value equal to the input impedance Z3 of the second matching section 60B which is also employed in the splitting/matching circuit 60. Thus, the first modulated signal SRF1 output by the first matching section 60A as a result of a splitting process and a matching process to the squaring circuit 40 provided at a stage following the splitting/matching circuit 60 has an amplitude and phase which match respectively the amplitude and phase of the second modulated signal SRF2 which is output by the second matching section 60B as a result of a splitting process and a matching process to the squaring circuit 40. As a result, it is possible to prevent the demodulation performance from deteriorating.

In addition, by providing the splitting/matching circuit 60 at a stage between the amplifier 34 and the squaring circuit 40 as shown in FIGS. 1 and 2, it is possible to properly set the output impedances Z4 and Z5 of the splitting/matching circuit 60. It is thus possible to avoid a leak of the first modulated signal SRF1 and a leak of the second modulated signal SRF2 from occurring between the input nodes IN1 and IN2 of the squaring circuit 40. In particular, by setting the output impedance Z4 of the first matching section 60A employed in the splitting/matching circuit 60 at a value smaller than the input impedance Z6 seen at the input node IN1 of the squaring circuit 40 and by setting the output impedance Z5 of the second matching section 60B employed in the splitting/matching circuit 60 at a value smaller than the input impedance Z7 seen at the input node IN2 of the squaring circuit 40. Accordingly, the leak voltages can be suppressed with a high degree of reliability.

In addition, in accordance with the first embodiment, the DC correction circuit 50 carries out a feedback offset DC correction process of adjusting the DC voltage Vdc included in the demodulated signal SDM having a base-band frequency to the reference voltage Vref. Thus, the demodulation process can be made stable and the clipping of the amplitude of the amplified demodulated signal can be avoided. As a result, the linearity of the amplified demodulated signal obtained as the demodulation output can be improved and the amplitude of the amplified demodulated signal can be increased. Accordingly, the performance of the demodulator 30A can be enhanced. In addition, since a DC correction process is carried out by the DC correction circuit 50 on the demodulated signal SDM output by the squaring circuit 40, it is possible to provide an effect that matching of the inputs to the squaring circuit 40 can be established with ease without affecting the inputs. On top of that, in the first embodiment, the DC correction circuit 50 is embedded in the same chip as the demodulator 30A instead of making use of a control unit implemented by a circuit external to the chip. As explained earlier, the DC correction circuit 50 is a section for detecting the DC voltage Vdc of the demodulated signal SDM and carrying out control to adjust the DC voltage Vdc to the reference voltage Vref. Thus, the number of pins provided for the chip can be reduced and the scale of the peripheral circuit can be decreased. By configuring the chip of the demodulator 30A to include only CMOS circuits for example, the cost of manufacturing the demodulator 30A can be reduced.

2. Second Embodiment

Next, a demodulator 30B according to a second embodiment of the present invention is explained. It is to be noted that, in the second embodiment, configuration elements same as their respective counterparts employed in the demodulator 30A according to the first embodiment described so far are denoted by the same reference numerals and reference notations as the counterparts. In addition, details of the configuration elements same as the respective counterparts are not explained again in order to avoid duplications of descriptions.
[Typical Configuration of Demodulator]

Figure 8:
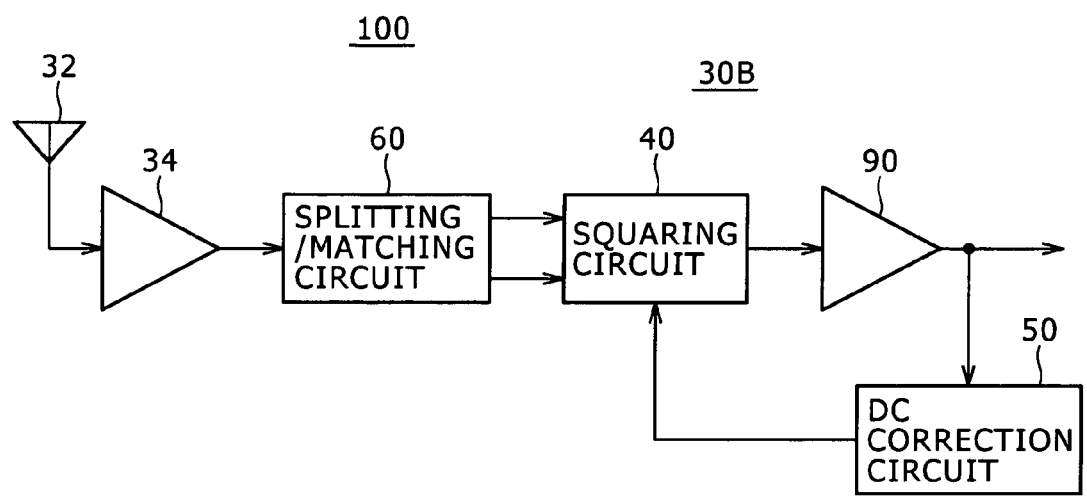
FIG. 8 is a block diagram showing a typical configuration of a demodulator according to a second embodiment of the present invention.
Figure 9:
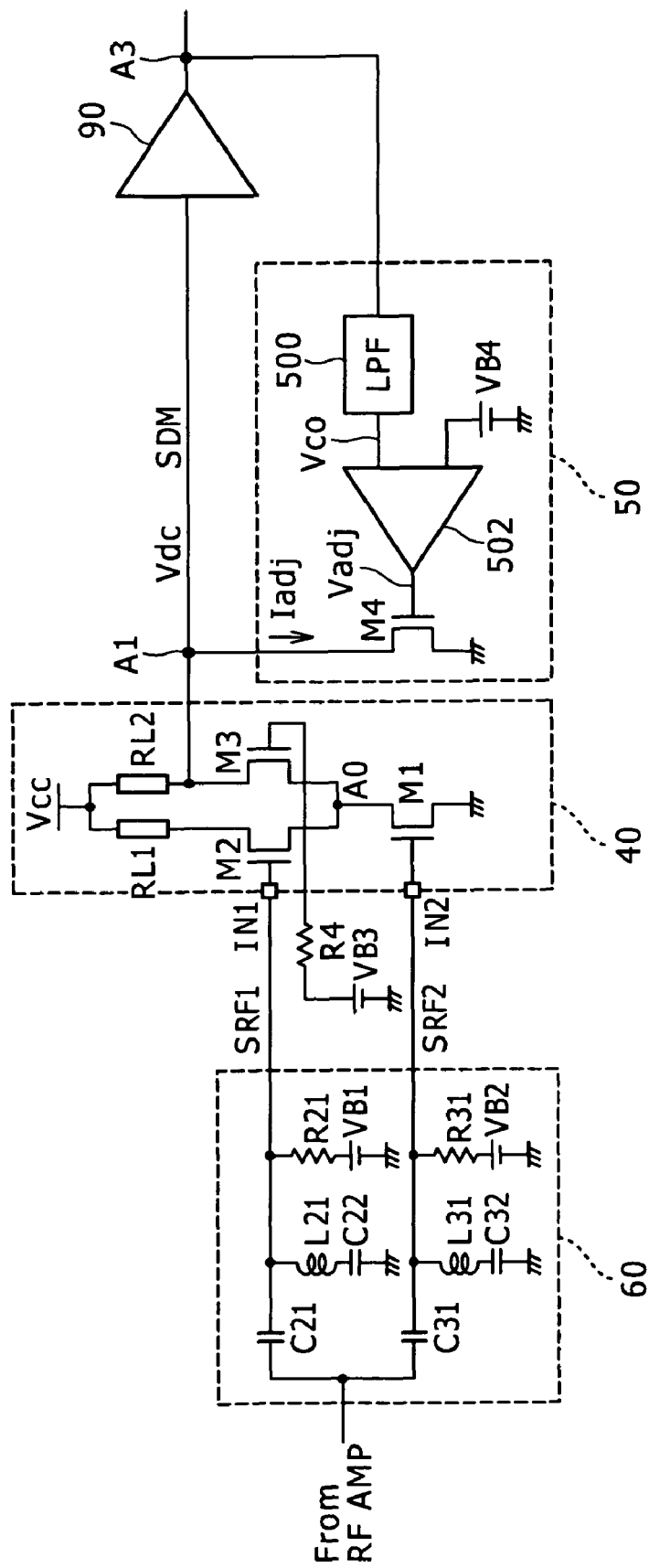
FIG. 9 is a circuit diagram showing typical configurations of a splitting/matching circuit, a squaring circuit and a DC correction circuit.
Figure 10:
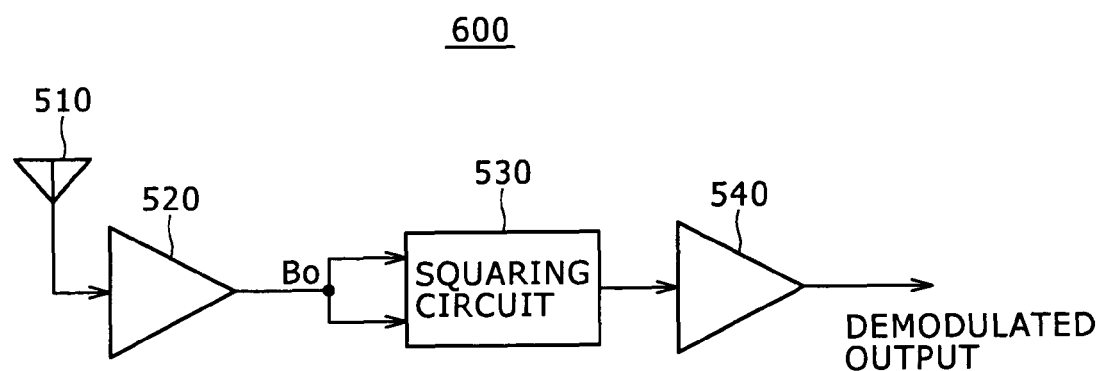
FIG. 10 is a block diagram showing a typical configuration of the existing demodulator.
Figure 11:
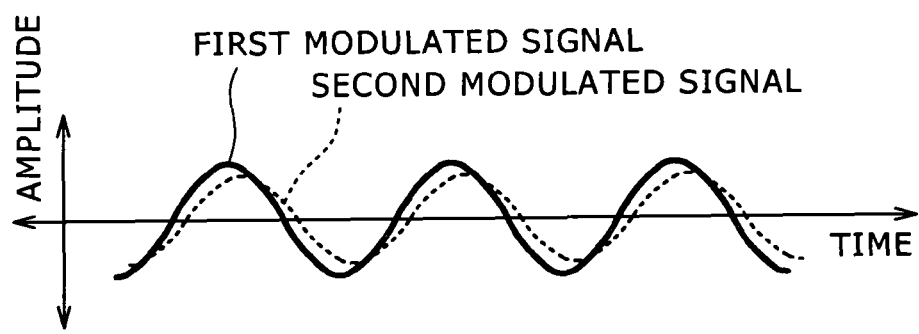
FIG. 11 is a diagram showing amplitude and phase shifts between a first modulated signal and a second modulated signal which are split from each other at a branch point.

FIG. 8 is a block diagram showing a typical configuration of a demodulator employed in the communication apparatus 100 to serve as the demodulator 30B according to the second embodiment of the present invention. FIG. 9 is a circuit diagram showing typical configurations of a splitting/matching circuit 60, a squaring circuit 40 and a DC correction circuit which are employed in the demodulator 30B according to the second embodiment. As shown in FIG. 8, the input node of the DC correction circuit 50 is connected to the output node of the amplifier 90. As shown in FIG. 9, the DC correction circuit 50 is configured to employ a low-pass filter 500, a comparator 502, a power supply VB4 and a transistor M4. The comparator 502 is a typical example of a comparison section according to the embodiment of the present invention whereas the power supply VB4 is a power supply for generating a reference electric potential. The input node of the low-pass filter 500 is connected to a connection point A3 which is wired to the output node of the amplifier 90. The output node of the low-pass filter 500 is connected to a specific one of the two input nodes of the comparator 502. The low-pass filter 500 is a section for supplying the demodulated signal SDM to the comparator 502 after the demodulated signal SDM has been amplified by the amplifier 90. The other one of the two input nodes of the comparator 502 is connected to the ground through the power supply VB4. The drain electrode of the transistor M4 is connected to a connection point A1 which is also wired to the output node of the squaring circuit 40 and the input node of the amplifier 90. The output node of the squaring circuit 40 is connected to the specific end of the load resistor RL2 in the same way as the demodulator 30A shown in FIG. 7. The gate electrode of the transistor M4 is connected to the output node of the comparator 502 whereas the source electrode of the transistor M4 is connected to the ground.
[Typical Operations of Demodulator]

The demodulated signal SDM output from the aforementioned specific end of the load resistor RL2 employed in the squaring circuit 40 is supplied by the amplifier 90 to be amplified by the amplifier 90. The amplifier 90 supplies the demodulated signal SDM amplified thereby to the low-pass filter 500 employed in the DC correction circuit 50 by way of the connection point A3. The demodulated signal SDM supplied to the low-pass filter 500 includes a DC voltage Vdc caused by a signal multiplication process carried out by the squaring circuit 40 and a DC voltage generated due to variations of the amplifier 90. The low-pass filter 500 passes only the two DC voltages, i.e., the DC voltage Vdc caused by a signal multiplication process carried out by the squaring circuit 40 and the DC voltage generated due to variations of the amplifier 90 itself or the like, supplying the two DC voltages to the comparator 502 as a DC voltage Vco.

The comparator 502 is a section for comparing the DC voltage Vco received from the low-pass filter 500 with the reference voltage Vref generated by the power supply VB4 and outputting a difference voltage obtained as a result of the comparison. The comparator 502 then supplies the difference voltage to the gate electrode of the transistor M4 as a variable DC offset. As will be described later, the DC offset is also referred to as the DC adjustment voltage Vadj cited before. The variable DC offset causes a drain current Iadj flowing through the transistor M4 to vary as well. The drain current Iadj is fed back to the output node of the squaring circuit 40 as a current which varies in accordance with variations in DC offset. If the DC voltage Vco fetched by the low-pass filter 500 changes, the DC offset also referred to as the DC adjustment voltage Vadj output by the low-pass filter 500 also changes, varying the drain current Iadj fed back to the squaring circuit 40. As a result, the DC voltage Vco of the demodulated signal SDM output by the squaring circuit 40 is adjusted to the reference voltage Vref. In this way, the drain current Iadj is controlled automatically in order to adjust the magnitude of the DC offset representing the difference between the DC voltage Vco of the demodulated signal SDM output by the squaring circuit 40 and the reference voltage Vref at zero.

As described above, in the case of the second embodiment, the DC correction circuit 50 fetches the DC voltage Vco from the demodulated signal SDM output by the amplifier 90 provided at a stage following the squaring circuit 40 and carries out a DC correction process on the DC voltage Vco. Thus, in the same way as the first embodiment, it is possible to simultaneously reduce the DC voltage Vdc caused by a signal multiplication process carried out by the squaring circuit 40 and the DC voltage generated due to variations of the amplifier 90 or the like at the same time.

It is to be noted that the technological range of the present invention is by no means limited to the first and second embodiments described above. That is to say, besides the first and second embodiments described above, the range of the present invention may further include a variety of additional modified versions as long as the additional modified versions fall within a domain which does not deviate from essentials of the present invention. As described earlier, each of the transistors employed in the first and second embodiments is an n-type MOSFET. However, each of the transistors employed in the first and second embodiments is by no means limited to the n-type MOSFET. For example, any transistor employed in the first and second embodiments can be possible such as a p-type MOSFET or a bipolar-type transistor.

The present application contains subject matter related to that disclosed in Japanese Priority Patent Application JP 2009-193393 filed with the Japan Patent Office on Aug. 24, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A demodulator, comprising:
a splitting/matching section for carrying out a matching process of making the amplitude and phase of a first modulated signal match respectively the amplitude and phase of a second modulated signal; and
a demodulation section for generating a demodulated signal on the basis of said first modulated signal and said second modulated signal, which have been subjected to said matching process carried out by said splitting/matching section, wherein
said splitting/matching section has
a splitting section for splitting a modulated signal, which has been obtained by modulating a carrier signal having a predetermined frequency on the basis of an original signal to be generated later by said demodulation section as said demodulated signal, into said first modulated signal and said second modulated signal,
a first matching section for receiving said first modulated signal from said splitting section at a first input impedance determined by first predetermined circuit-element constants of said first matching section, and
a second matching section for receiving said second modulated signal from said splitting section at a second input impedance determined by second predetermined circuit-element constants of said second matching section,
said first circuit-element constants determining said first input impedance of said first matching section and said second circuit-element constants determining said second input impedance of said second matching section are set at values determined in advance in order to make said first input impedance equal to said second input impedance.

2. The demodulator according to claim 1, wherein said carrier signal is a signal of a millimeter-wave frequency band.

3. The demodulator according to claim 2, wherein
said demodulation section has a first input section for receiving said first modulated signal from said first matching section and a second input section for receiving said second modulated signal from said second matching section;
the output impedance of said first matching section employed in said splitting/matching section is set at a value smaller than an input impedance seen from said first input section of said demodulation section as one of input impedances of said demodulation section; and
the output impedance of said second matching section employed in said splitting/matching section is set at a value smaller than an input impedance seen from said second input section of said demodulation section as another input impedance of said demodulation section.

4. The demodulator according to claim 3, wherein
said first matching section employed in said splitting/matching section includes:
a first capacitor having a specific node thereof connected to said splitting section and the other node thereof connected to said first input section of said demodulation section through a first connection point and a second connection point;
an inductor having a specific end thereof connected to said first connection point provided between said other node of said first capacitor and said first input section of said demodulation section;
a second capacitor having a specific node thereof connected to the other end of said inductor and the other node thereof connected to a power supply for generating a low electric potential;
a resistor having a specific end thereof connected to said second connection point provided between said other node of said first capacitor and said first input section of said demodulation section; and
a bias generation power supply having a specific node thereof connected to the other end of said resistor and the other node thereof connected to said power supply for generating a low electric potential; whereas
said second matching section employed in said splitting/matching section includes
a first capacitor having a specific node thereof connected to said splitting section and the other node thereof connected to said second input section of said demodulation section through a first connection point and a second connection point;
an inductor having a specific end thereof connected to said first connection point provided between said other node of said first capacitor and said second input section of said demodulation section;
a second capacitor having a specific node thereof connected to the other end of said inductor and the other node thereof connected to a power supply for generating a low electric potential;
a resistor having a specific end thereof connected to said second connection point provided between said other node of said first capacitor and said second input section of said demodulation section; and
a bias generation power supply having a specific node thereof connected to the other end of said resistor and the other node thereof connected to said power supply for generating a low electric potential.

5. The demodulator according to claim 1, said demodulator further having a DC correction section for fetching a DC voltage of said demodulated signal generated by said demodulation section from said demodulated signal; and adjusting said DC voltage of said demodulated signal so as to make said DC voltage equal to a reference voltage set in advance.

6. The demodulator according to claim 5, wherein
said demodulation section includes:
a first transistor having the gate electrode thereof used for receiving said first modulated signal;
a second transistor having the drain electrode thereof connected to the source electrode of said first transistor, the source electrode thereof connected to a power supply for generating a low electric potential and the gate electrode thereof used for receiving said second modulated signal; and
a load resistor having a specific end thereof connected to the drain electrode of said first transistor and the other end thereof connected to a power supply for generating a high electric potential; whereas said DC correction section includes
a low-pass filter for passing on said DC voltage of said demodulated signal output from said load resistor employed in said demodulation section;
a comparison section for comparing a DC voltage passed on by said low-pass filter as said DC voltage of said demodulated signal with said reference voltage and for outputting a difference voltage representing a comparison result as a DC offset; and
a transistor with the drain electrode thereof connected to said load resistor employed in said demodulation section, the gate electrode thereof connected to the output node of said comparison section and the source thereof connected to said power supply for generating a low electric potential.

7. The demodulator according to claim 6, said modulator further including an amplifier for amplifying said demodulated signal generated by said demodulation section and for outputting a signal obtained as an amplification result, wherein
the input node of said low-pass filter employed in said DC correction section is connected to the output node of said amplifier.

8. A demodulator, comprising:
splitting/matching means for carrying out a matching process of making the amplitude and phase of a first modulated signal match respectively the amplitude and phase of a second modulated signal; and
demodulation means for generating a demodulated signal on the basis of said first modulated signal and said second modulated signal, which have been subjected to said matching process carried out by said splitting/matching means, wherein
said splitting/matching means has
splitting means for splitting a modulated signal, which has been obtained by modulating a carrier signal having a predetermined frequency on the basis of an original signal to be generated later by said demodulation means as said demodulated signal, into said first modulated signal and said second modulated signal,
first matching means for receiving said first modulated signal from said splitting means at a first input impedance determined by first predetermined circuit-element constants of said first matching means, and
second matching means for receiving said second modulated signal from said splitting means at a second input impedance determined by second predetermined circuit-element constants of said second matching means,
said first circuit-element constants determining said first input impedance of said first matching means and said second circuit-element constants determining said second input impedance of said second matching means are set at values determined in advance in order to make said first input impedance equal to said second input impedance.

* * * * *